United States Patent
Nishi et al.

(10) Patent No.: US 7,253,021 B2
(45) Date of Patent: *Aug. 7, 2007

(54) TRANSFER MOLDING APPARATUS AND METHOD FOR MANUFACTURING SEMICONDUCTOR DEVICES

(75) Inventors: Hiroyuki Nishi, Miyazaki (JP); Akira Sugai, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/890,222

(22) Filed: Jul. 14, 2004

(65) Prior Publication Data

US 2004/0248328 A1    Dec. 9, 2004

Related U.S. Application Data

(60) Continuation of application No. 09/893,455, filed on Jun. 29, 2001, now Pat. No. 6,767,484, which is a division of application No. 09/265,841, filed on Mar. 10, 1999, now Pat. No. 6,267,577.

(30) Foreign Application Priority Data

Jul. 30, 1998    (JP)    .................... 10-215602

(51) Int. Cl.
*H01L 21/00*    (2006.01)

(52) U.S. Cl. .................................................. 438/69
(58) Field of Classification Search ............... 438/5–7, 438/10–11, 104, 106–114, 118, 141–123, 438/128, 129, 135, 142, 145, 149, 151, 157
See application file for complete search history.

(56) References Cited

U.S. PATENT DOCUMENTS

| 3,741,700 | A | | 6/1973 | Hutchinson et al. |
| 3,836,303 | A | | 9/1974 | Horley |
| 4,038,004 | A | | 7/1977 | Hartmann |
| 4,426,341 | A | | 1/1984 | Tsuzuku et al. |
| 4,900,485 | A | | 2/1990 | MuraKami |
| 4,954,301 | A | | 9/1990 | Saeki et al. |
| 5,164,335 | A | * | 11/1992 | Sato et al. .............. 264/272.15 |
| 5,225,373 | A | * | 7/1993 | Takahashi et al. ............. 438/51 |
| 5,371,044 | A | * | 12/1994 | Yoshida et al. ......... 264/272.17 |

(Continued)

FOREIGN PATENT DOCUMENTS

JP    05-175264    7/1993

Primary Examiner—Michael Lebentritt
Assistant Examiner—Andre' Stevenson
(74) Attorney, Agent, or Firm—Volentine & Whitt, P.L.L.C.

(57) ABSTRACT

A method of transfer molding, wherein a top-half mold and a bottom-half mold of an apparatus form a plurality of cavities interconnected, and wherein a pressure adjuster reduces the pressure of the cavities every time a specified amount of resin is supplied into any one of a plurality of cavities.

12 Claims, 8 Drawing Sheets

U.S. PATENT DOCUMENTS

| | | |
|---|---|---|
| 5,454,991 A | 10/1995 | Brew |
| 5,626,887 A | 5/1997 | Chou et al. |
| 5,690,885 A | 11/1997 | Fierkens |
| 5,851,559 A | 12/1998 | Scribner et al. |
| 5,856,211 A * | 1/1999 | Tonazzi et al. ............... 438/69 |
| 5,971,737 A | 10/1999 | Sharp |
| 6,267,577 B1 | 7/2001 | Nishi et al. |
| 6,444,035 B1 | 9/2002 | Nowak et al. |
| 6,495,083 B2 | 12/2002 | Weber |
| 6,767,484 B2 * | 7/2004 | Nishi et al. ................ 264/40.1 |
| 6,909,929 B2 * | 6/2005 | Farnworth et al. .......... 700/120 |
| 2002/0160363 A1 * | 10/2002 | McDevitt et al. .............. 435/6 |
| 2003/0064422 A1 * | 4/2003 | McDevitt et al. .......... 435/7.32 |
| 2003/0143780 A1 * | 7/2003 | Shirasaka .................. 438/125 |
| 2004/0248328 A1 * | 12/2004 | Nishi et al. .................... 438/14 |

\* cited by examiner

TRANSFER MOLDING APPARATUS AND METHOD FOR MANUFACTURING SEMICONDUCTOR DEVICES

CROSS REFERENCE TO RELATED APPLICATIONS

This is a continuation application of application Ser. No. 09/893,455, filed Jun. 29, 2001 now U.S. Pat. No. 6,767,484, which is a divisional application of Ser. No. 09/265,841 filed Mar. 10, 1999, now U.S. Pat. No. 6,267,577, which are hereby incorporated by reference in their entirety for all purposes.

BACKGROUND OF THE INVENTION

1. Field of the Invention

The present invention relates to a transfer molding apparatus and a method of manufacturing semiconductor devices.

2. Related Art

In the manufacture of semiconductor devices, transfer molding apparatuses for encapsulating semiconductor devices mounted on lead frames are conventionally used. As shown in FIG. 7, the transfer molding apparatus comprises a transfer pot 10 into which solid thermosetting resin (tablets) is loaded, a plunger 12 for transferring the thermosetting resin 28 (hereafter referred to as the resin 28. See FIG. 8) that has been fluidified in the transfer pot, a position sensor 14 for detecting the position of the plunger 12, a top-half mold 16a fixed to a top platen 26a, a bottom-half mold 16b fixed to a bottom-half platen 26b, heaters 18 for heating the top-half and bottom-half molds 16a, 16b to a predetermined temperature, and a suction pump 24 for reducing the pressure in the cavities 20 by extracting the air from a chamber 30 where the top-half and bottom-half molds 16a, 16b are disposed.

When the top-half and bottom-half molds 16a, 16b are closed, two cavities 20 each for setting up a molding space for a plastic IC package, and runners 22 and gates 23 as resin supply paths leading to the cavities 20 are formed.

When the top-half and bottom-half molds 16a, 16b are closed, air-vent slots 25 are also formed at the outer end positions of the two cavities 20 opposite the gates 23 located at the inner ends thereof. When the chamber 30 is placed at reduced pressure by extracting air by a suction pump 24, the air is sucked out from the runners 22 and the gates 23 through the air-vent slots 25, so that the cavities 20 are placed at reduced pressure. The runners 22 guide the resin 28 into the cavities 20 through the gates 23 that are open to the corresponding cavities 20.

Referring to FIG. 8, description will be made of a method of manufacturing semiconductor devices on a transfer molding apparatus structured as described above. FIG. 8 shows only the principal portions for convenience of explanation. First of all, a semiconductor-device-mounted lead frame (not shown) is set in the bottom-half mold 16b, a resin tablet is loaded in the transfer pot 10, and by lowering the top platen 26a, the top-half mold 16a and the bottom-half mold 16b are closed, so that a cavity 20, for example, is formed as shown in FIG. 8(a). At this point in time, the semiconductor device has been placed almost in the center of the cavity 20. In addition, the pressure in the chamber 30 has been reduced to about 30 to 99 Pa by the suction pump 24.

While the resin tablet charged in the transfer pot 10 is being melted by heating it to 160° to 190° C. with the heaters 18, the resin is extruded from the transfer pot 10 by raising the plunger 12. By this operation, the molten resin 28 is introduced into the runner 22 as shown in FIG. 8(b).

By the increasing the forcing pressure from the plunger 12, the resin 28 in the runner 22 is guided through the gate 23 into the cavity 20 as shown in FIG. 8(c). As shown in FIG. 8(d), when the resin 28 has been filled into the cavity 20, the forcing pressure from the plunger 12 is stopped, and the resin 28 in the cavity 20, the runner 22, and the gate 23 is cured. After the resin 28 is cured sufficiently, the top platen 26a (see FIG. 7) is raised, and the semiconductor device with a lead frame in a package of resin 20 that hardened around the semiconductor element is ejected. Subsequently, the excess resin is removed and whittled down to shape, and the lead-frame portion is cut off and the outer leads are formed to thereby produce a semiconductor package. Subsequently, the excess resin is removed, the package is whittled down to shape, the frame portion of the lead frame is trimmed, and the outer leads are formed. Thus, a semiconductor device is produced.

In the transfer molding apparatus constructed as described, there are possibilities of an unfilled region (voids) 29 being formed in the top-cavity portion or the bottom-cavity portion of the mold due to a difference in resin-filling speed between the top-cavity portion and the bottom-cavity portion, which partition is made by the semiconductor element loaded in the cavity 20. Voids are unwanted because they give rise to a warp or deformation in the package or decreases its strength or humidity resistance.

There have been countermeasures against the voids. One is to provide a suction port communicating with the cavity, and directly reduce the pressure in the cavity by the use of a suction pump to decrease the remaining air in the top-cavity portion or the bottom-cavity portion to prevent the occurrence of voids.

The other is to place the chamber 30 itself in a reduced-pressure atmosphere so that the remaining air in the top-cavity portion or the bottom-cavity portion should be extracted through the air-vent slot 25 and to thereby prevent the occurrence of voids.

However, in the transfer molding apparatus constructed as described above, because the resin passes through the gate of a smaller diameter than that of the runner when it enters a cavity, the resin is subjected to pressure at the gate, and the resin in compressed state is injected into the cavity. Therefore, if the cavity is at reduced pressure when a specified amount of resin is introduced into the cavity, there is a relatively large pressure difference between the pressure in the cavity and the pressure in the resin. A problem here is that when there is such a large pressure difference, the air bubbles in the resin expand notably, and remain as voids in the package.

Thermosetting resins have a characteristic that curing does not progress in proportion to the passage of time, but curing occurs after the viscosity decreases once. Therefore, with some kinds of thermosetting resins, the viscosity sometimes drops temporarily while the cavity is being filled with a molding compound. Also in this case, there is a problem that the air bubbles expand remarkably in the resin and remain as voids in the package.

SUMMARY OF THE INVENTION

The present invention has been made to solve the above problems, and has as its object to provide a transfer molding apparatus and a method for manufacturing semiconductor devices, which are free of voids remaining in a resin when filled in the cavities.

To achieve the above object, the transfer molding apparatus according to the present invention comprises:

a top-half mold and a bottom-half mold for forming a cavity as a molding space for a package and a transfer pot as a loading space, communicating with the cavity, for resin to be injected into the cavity;

a plunger for forcing the resin out of the transfer pot into the cavity; and a pressure adjuster in the cavity when a specified amount of resin has been injected into the cavity.

Because the pressure adjuster reduces the pressure in a cavity after a specified amount of resin has been injected into the cavity, the cavity is at normal pressure at a point in time when the supply of a specified amount of resin is finished and the pressure difference between the pressure in the cavity and the pressure in the resin is relatively small. Therefore, the air bubbles in the resin can be prevented from expanding remarkably.

Because the pressure adjuster reduces the pressure in a cavity when a specified amount of resin has been injected into the cavity, the remaining air in the unfilled region of the top cavity portion or the bottom cavity portion can be decreased, so that the voids can be reduced, which occur due to a difference in filling rate between the top cavity portion and the bottom cavity portion.

In the transfer molding apparatus described above, the top-half mold and the bottom-half mold form a plurality of interconnected cavities, and the pressure adjuster reduces the pressure of the cavities every time any one of the plurality of cavities is supplied with a specified amount of resin.

Even in such a construction that a plurality of cavities are connected to one transfer pot, each cavity is kept at normal pressure until it is supplied with a specified amount of resin. Therefore, the entrapped air in the resin in each cavity when it is filled with the specified amount of resin can be prevented from expanding to a great extent, with the result that it is possible to efficiently obtain semiconductor devices in packages of good quality.

Further, in the transfer molding apparatus, the pressure adjuster has a position detector for detecting the position of the plunger, and reduces the pressure in each cavity by detecting the plunger position at a point in time when the cavity has been supplied with a specified amount of resin. By using this mechanism, the injected amount of resin can be detected with high accuracy, which makes it possible to suitably control timing of pressure reduction by the pressure adjuster.

In the transfer molding apparatus described above, the pressure adjuster has a time counter, and reduces the pressure in a cavity when the time counter has counted a set length of time from the start of movement of the plunger until the cavity is supplied with a specified amount of resin.

More specifically, a length of time from the start of plunger movement until the cavity is supplied with a specified amount of resin is measured, and at the end of a preset time, the pressure adjuster reduces the pressure in the cavity. Therefore, it is possible to detect the injected amount with high accuracy, and suitably control timing of pressure reduction by the pressure adjuster.

In the method for manufacturing semiconductor devices, a semiconductor-element-mounted lead frame is placed between the top-half mold and the bottom-half mold, and the pressure in a cavity is reduced when a specified amount of resin has been filled in the cavity formed by the top-half mold and the bottom-half mold.

In other words, according to the method according to the present invention, because the pressure in a cavity is not reduced until the cavity is supplied with a specified amount of resin, the cavity prior to injection of resin is maintained at normal pressure. For this reason, a pressure difference between the pressure in the resin and the pressure in the cavity is relatively small when the cavity has been supplied with resin. Therefore, the entrapped air in the resin can be prevented from expanding remarkably.

Needless to say, because the pressure in the cavity is reduced after the cavity has been supplied with a specified amount of resin, the remaining air in the unfilled region of the top-cavity portion or the bottom-cavity portion can be reduced, and it becomes possible to prevent the occurrence of voids due to a difference in filling rate between the top-cavity portion and the bottom-cavity portion.

DESCRIPTION OF THE PREFERRED EMBODIMENTS

Embodiments of the present invention will be described with reference to FIGS. 1 to 6.

First Embodiment

Figure 1:
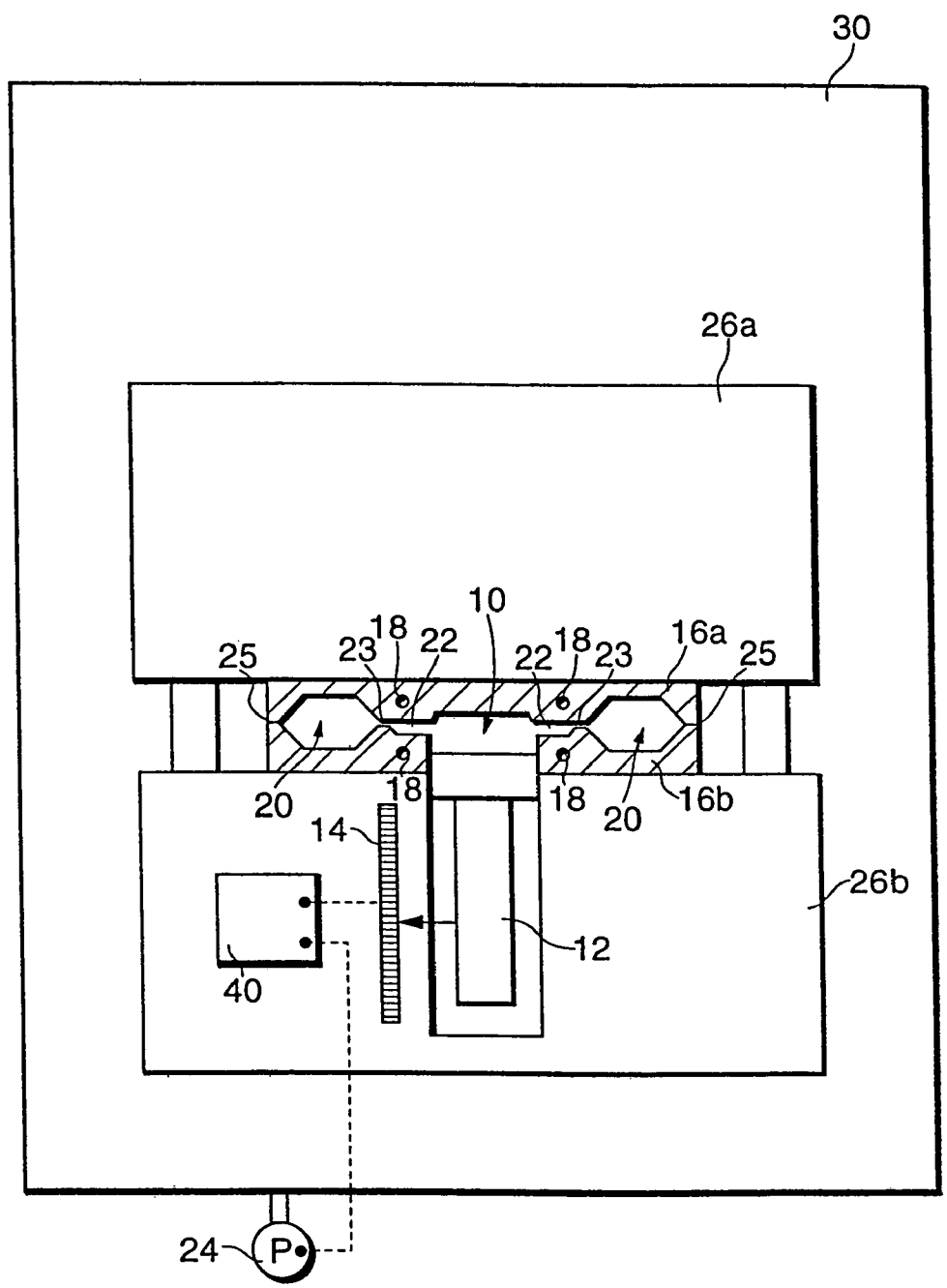
FIG. 1 is a sectional view showing a schematic construction of a transfer molding apparatus according to a first embodiment of the present invention.

A first embodiment will be described with reference to FIGS. 1 and 2. As shown in FIG. 1, the transfer molding apparatus according to the first embodiment comprises a top-half mold 16a fixed to a top platen 26a; a bottom-half mold 16b fixed to a bottom platen 26b; heaters 18 for heating the top-half and the bottom-half molds 16a, 16b to a predetermined temperature; a transfer pot 10, formed by the top-half and the bottom-half molds, for accepting a tablet of a thermosetting resin, an epoxy resin for example, formed by the top-half and the bottom-half molds 16a, 16b; a plunger 12 for extruding the resin 28 melted in the transfer pot 10; a position sensor 14 for detecting the position of the plunger 12; a suction pump 24 for reducing the pressure in a chamber 30, having the top-half mold 16a and the bottom-half mold 16b installed therein, thereby placing the cavities 20 at reduced pressure; and a pressure controller 40 for controlling the drive of the suction pump 24 according to the amount of movement of the plunger 12.

When the top-half mold 16a and the bottom-half mold 16b are closed, two cavities 20 as molding spaces for packages and two runners 22 for guiding the resin into the cavities 20 through gates 23, which are open to the cavities 20, are formed. The runners (distribution paths) 22 are provided on both sides of the transfer pot 10 and communicate with each other through the transfer pot 10.

An air-vent slot 25 is formed on the side of each cavity 20 that is opposite the side open to the gate 23. As will be described later, when the chamber 30 is placed at reduced pressure by using a suction pump 24, the air in the cavities 20 is extracted through the air-vent slots 25, so that the cavities are also placed at reduced pressure.

The pressure controller 40 drives the suction pump 24 to reduce the pressure in the chamber 30 when the position sensor 14 detects that the plunger 12 is at the position indicating that each cavity has been supplied with a specified amount of resin. The pressure controller 40 causes the suction pump 24 to stop when the position sensor 14 detects the position of the plunger 12, which indicates that the cavities 20 have been filled with resin 28. Then, the pressure controller 40 brings the chamber 30 to normal pressure by releasing a vent valve of the chamber 30.

Referring to FIG. 2, description will now be made of a method for manufacturing semiconductor devices on the transfer molding apparatus constructed as stated. Note that FIG. 2 shows the principal parts only for convenience of explanation. A semiconductor-element-mounted lead frame (not shown) is set in the bottom-half mold 16b, and then a resin tablet is charged in the transfer pot 10, and by lowering the top platen 26a, the top-half mold 16a and the bottom-half mold 16b are closed as shown in FIG. 2(a). At this time, the semiconductor element, not shown, has been placed almost in the center of the cavity 20.

Then, while the tablet charged into the transfer pot 10 is melted by heating it to 160° to 190° C., the plunger 12 is raised to extrude the resin from the transfer pot 10. Consequently, the molten resin 28 is introduced into the runner 22.

Figure 2A:
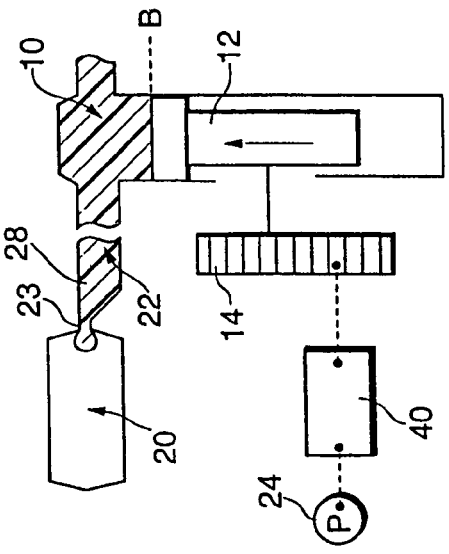
FIGS. 2(a)-2(d) are fragmentary diagrams for explaining the motion of the transfer molding apparatus shown in FIG. 1.
Figure 2B:
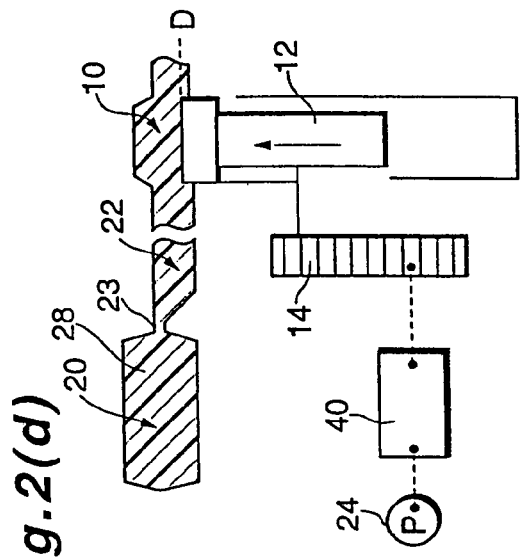

The position sensor 14 is detecting the position of the plunger 12 from the start of its movement. As shown in FIG. 2(b), the position sensor 14 outputs a detection signal to the pressure controller 40 when the position sensor 14 detects that the leading end of the plunger 12 has reached the position B, which indicates that a specified amount of resin has been supplied from the runner 22 into the cavity 20.

On receiving a detection signal from the position sensor 14, the pressure controller 40 transmits a drive start signal to the suction pump 24. In response to the drive start signal, the suction pump 24 starts to extract the air from the chamber 30, and gradually reduces the pressure in the chamber 30 to about 30 to 90 Pa. Therefore, even if the resin 28 has been compressed at position of the gate 23 and the pressurized resin 28 is injected into the cavity 20, because the cavity is gradually changed from normal pressure to reduced pressure, the relative pressure difference between the pressure acting on the air bubbles in the resin 28 and the pressure in the cavity 20 can be limited to a small degree, the air bubbles entrapped in the resin can be prevented from expanding greatly.

Figure 2C:
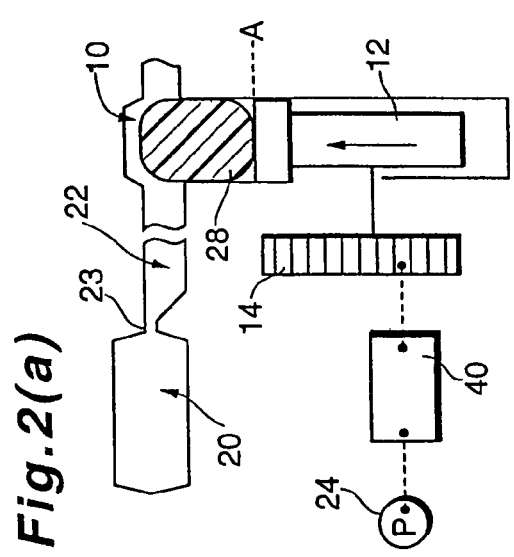

Timing for reducing the pressure in the chamber 30 by using the suction pump 24 may be when the resin decreases in viscosity and starts to harden, for example (in this case, when the resin 28 has been injected to about one half of the cavity 20 as shown in FIG. 2(c)). In other words, the timing for chamber pressure reduction may be when the leading end of the plunger 12 has reached the position C.

As described above, if the pressure in the chamber 30 is decreased after the viscosity of the resin has decreased, because the resin has started to harden, the air bubbles in the resin are less liable to expand.

Figure 2D:
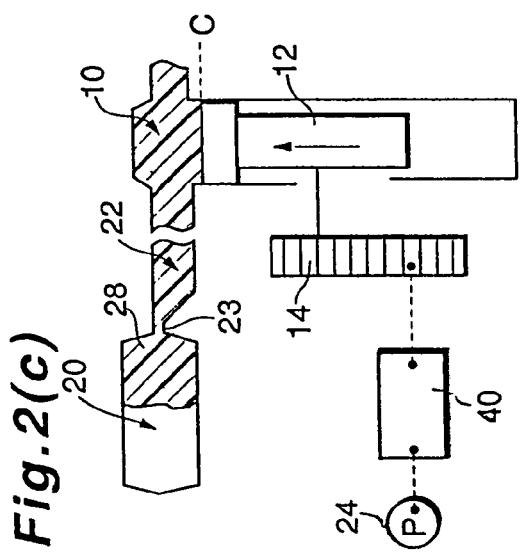

As shown in FIG. 2(d), when the cavity 20 is completely filled with resin 28, in other words, when the leading end of the plunger 12 has reached the position D, the position sensor 14 outputs a detection signal to the pressure controller 40. When receiving the detection signal from the position sensor 14, the pressure controller 40 transmits a drive stop signal to the suction pump 24 to stop its operation. On the other hand, the chamber 30 is brought back to normal pressure. At the same time, the plunger 12 is stopped. Subsequently, the resin 28 is cured.

After the resin 28 has been sufficiently cured, the top platen 26a (see FIG. 1) is raised, and a semiconductor device with a lead frame in a package of resin 28 that hardened around the semiconductor element is ejected. Subsequently, the excess resin remaining in the runner 22 or the like is removed, the package is whittled down to shape, the frame portion of the lead frame is trimmed, and the outer leads are formed. Thus, a semiconductor device is obtained.

As has been described, in the first embodiment, when the position sensor 14 detects that a specified amount of resin 28 has been injected into the cavity 20, the pressure controller 40 causes the suction pump 24 to operate to reduce the pressure in the cavity 20. Therefore, the relative pressure difference between the pressure acting on the air bubbles in the resin 28 and the pressure in the cavity 20 can be limited to a small degree until the cavity 20 is supplied with a specified amount of resin 28. For this reason, the air bubbles in the resin 28 can be prevented from expanding remarkably, which makes it possible to eliminate chances of voids remaining in the package.

If the pressure in the chamber 30 is reduced after a drop occurred in the viscosity of the resin 28 being injected into the cavity 20, it follows that the curing of the resin has started. In this case, the air bubbles in the resin 28 can be prevented from expanding remarkably, leaving less chances of the voids remaining in the package.

Second Embodiment

Figure 3:
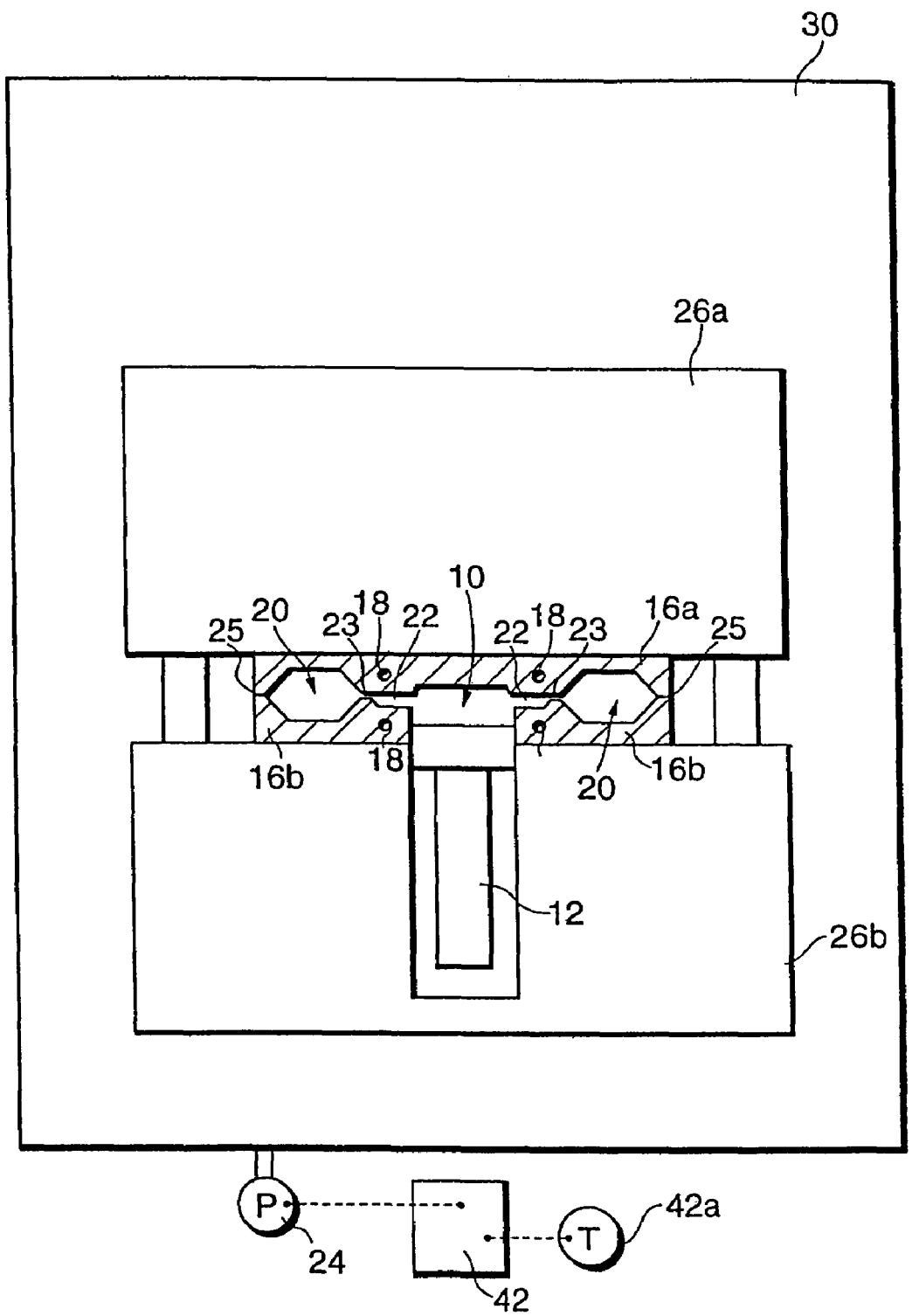
FIG. 3 is a sectional view showing a schematic construction of the transfer molding apparatus according to a second embodiment of the present invention.

Referring to FIGS. 3 and 4, a second embodiment of the present invention will be described. As shown in FIG. 3, the transfer molding apparatus according to the second embodiment comprises a top-half mold 16a fixed to a top platen 26a; a bottom-half mold 16b fixed to a bottom platen 26b; heaters 18 for heating the top-half and the bottom-half molds 16a, 16b to a predetermined temperature; a transfer pot 10, for accepting a tablet of a thermosetting resin, an epoxy resin for example, formed by the top-half and the bottom-half molds 16a and 16b; a plunger 12 for extruding the resin 28 melted in the transfer pot 10; a suction pump 24 for reducing the pressure in the chamber 30, having the top-half and the bottom-half molds 16a, 16b installed therein, thereby placing the cavities 20 at reduced pressure; and a pressure controller 42 for controlling the drive of the suction pump 24 according to the amount of movement of the plunger 12.

When the top-half mold 16a and the bottom-half mold 16b are closed, two runners (distribution paths) 22 for guiding the resin into the cavities 20 through gates 23, which are open to the cavities 20 are formed.

An air-vent slot 25 is formed on the side of each cavity 20 that is opposite the side open to the gate 23. When the chamber 30 is placed at reduced pressure by using a suction pump 24, the air in the cavities is extracted through the air-vent slots 25, so that the cavities 20 are also placed at reduced pressure.

The pressure controller 42 is connected to a timer 42a that counts the elapsed time from the start of plunger movement. The timer 42a, when it has counted the time until the cavity 20 is supplied with a specified amount of resin, outputs a detection signal to the pressure controller 42. In response, the pressure controller 42 causes the suction pump 24 to operate to reduce the pressure in the chamber 30. When the timer 42a has counted the time until the supply of resin 28 into the cavity 20a is finished, the pressure controller 42 causes the suction pump 24 to stop. On the other hand, the chamber 30 is returned to normal pressure.

Referring to FIG. 4, description will be made of a method of manufacturing semiconductor devices on the transfer molding apparatus constructed as described. FIG. 4 shows the principal parts only for convenience of explanation, and depicts the chamber 30 with an alternate long and short dash line in a conceptual diagram.

Figure 4B:
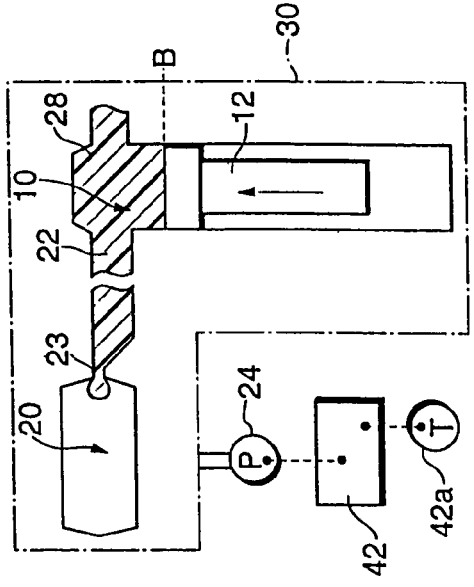
FIGS. 4(a)-4(d) are fragmentary diagrams for explaining the motion of the transfer molding apparatus shown in FIG. 3.
Figure 4D:
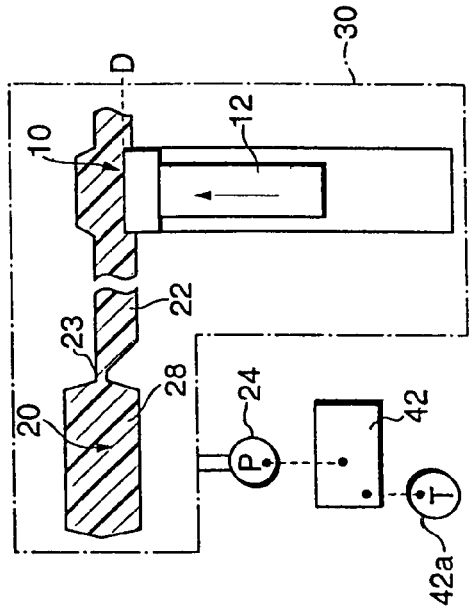
Figure 4A:
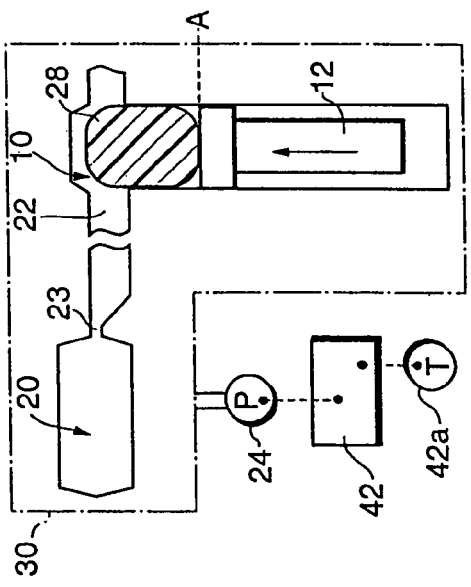

After a semiconductor-element-mounted lead frame (not shown) is set in the bottom-half mold 16b, a resin tablet is charged in the transfer pot 10, and by lowering the top platen 26a, the top-half mold 16a and the bottom-half mold 16b are closed as shown in FIG. 4(a). At this point in time, the semiconductor element, not shown, has been placed almost in the center of the cavity 20.

While the resin tablet charged in the transfer pot 10 is being melted by heating it to 160° to 190° C. by the heaters 18, the resin is extruded from the transfer pot 10 by raising the plunger 12. By this operation, the molten resin 28 is introduced into the runner 22.

The timer 42a starts counting time from the start of plunger movement, and as shown in FIG. 4(b), when the leading end of the plunger 12 has moved from position A to position B and the timer 42a counts to time t1 that indicates a specified amount of resin 28 has been supplied from the runner 22 into the cavity 20, the timer 42a outputs a detection signal to the pressure controller 42. On receiving a detection signal from the timer 42a, the pressure controller 42 sends a drive start signal to the suction pump 24. In response to the drive start signal, the suction pump 24 starts to extract the air from the chamber 30, thus reducing the pressure in the chamber 30 to about 30 to 99 Pa.

In other words, when the timer has counted the previously calculated time t1 till each cavity 20 is supplied with a specified amount of resin 28, the suction pump 24 gradually reduces the pressure in the cavity 20. For this reason, even if the resin 28 has been compressed at the gate position 23 and the pressurized resin is injected into the cavity, the relative pressure difference between the pressure acting on the air bubbles in the resin 28 and the pressure in the cavity 20 is limited to a small degree. Therefore, the air bubbles entrapped in the resin can be prevented from expanding remarkably.

Figure 4C:
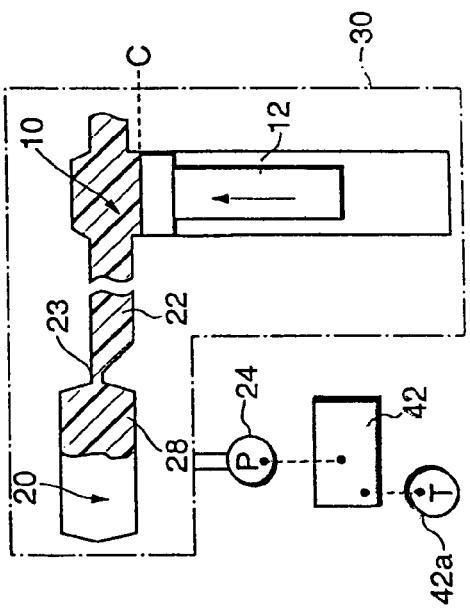

Timing for reducing the pressure in the chamber 30 by using the suction pump 24 may be, for example, when the resin decreases in viscosity and starts to harden (in this case, as shown in FIG. 4(c), when the resin 28 has been injected up to one half of the cavity 20). In other words, the timing for chamber pressure reduction may be when the timer 42a has counted time t2.

As described above, if the pressure in the chamber 30 is decreased after the resin has decreased in viscosity and has started to harden, the air bubbles in the resin are less liable to expand.

As shown in FIG. 4(d), when the cavity 20 is completely filled with resin 28, in other words, when the timer 42a has counted time t3 corresponding to the complete filling, the timer 42a outputs a detection signal to the pressure controller 42. When receiving the detection signal from the timer 42a, the pressure controller 42 transmits a drive stop signal to the suction pump 24 to stop its operation. On the other hand, the chamber 30 is brought back to normal pressure.

After the resin 28 has been sufficiently cured, the top platen 26a (see FIG. 3) is raised, and the semiconductor device with a lead frame in a package of resin 28 that hardened around the semiconductor element is ejected. Subsequently, the excess resin is removed, the package is whittled down to shape, the frame portion of the lead frame is trimmed, and the outer leads are formed. Thus, a semiconductor device is obtained.

As has been described, in the second embodiment, when the timer 42a detects the time when a specified amount of resin 28 has been supplied to the cavity 20, the pressure controller 42 causes the suction pump 24 to operate to reduce the pressure in the cavity 20. Therefore, the relative pressure difference between the pressure acting on the air bubbles in the resin 28 and the pressure in the cavity 20 can be limited to a small degree. For this reason, even when the specified amount of resin 28 has been supplied to the cavity 20, the air bubbles in the resin 28 can be prevented from expanding greatly, which makes it possible to eliminate chances of voids remaining in the package.

Furthermore, even when the pressure in the chamber 30 is reduced after the resin 28 being injected into the cavity 20 has decreased in viscosity and has started to be cured, the air bubbles in the resin 28 can be prevented from expanding greatly during filling.

Third Embodiment

A third embodiment of the present invention will be described with reference to FIGS. 5 and 6. In the transfer molding apparatus according to the third embodiment, two pairs of first and second cavities 20a, 20b, each pair being interconnected through a second runner 22b, are formed by the top-half mold 16a and the bottom-half mold 16b.

Figure 5:
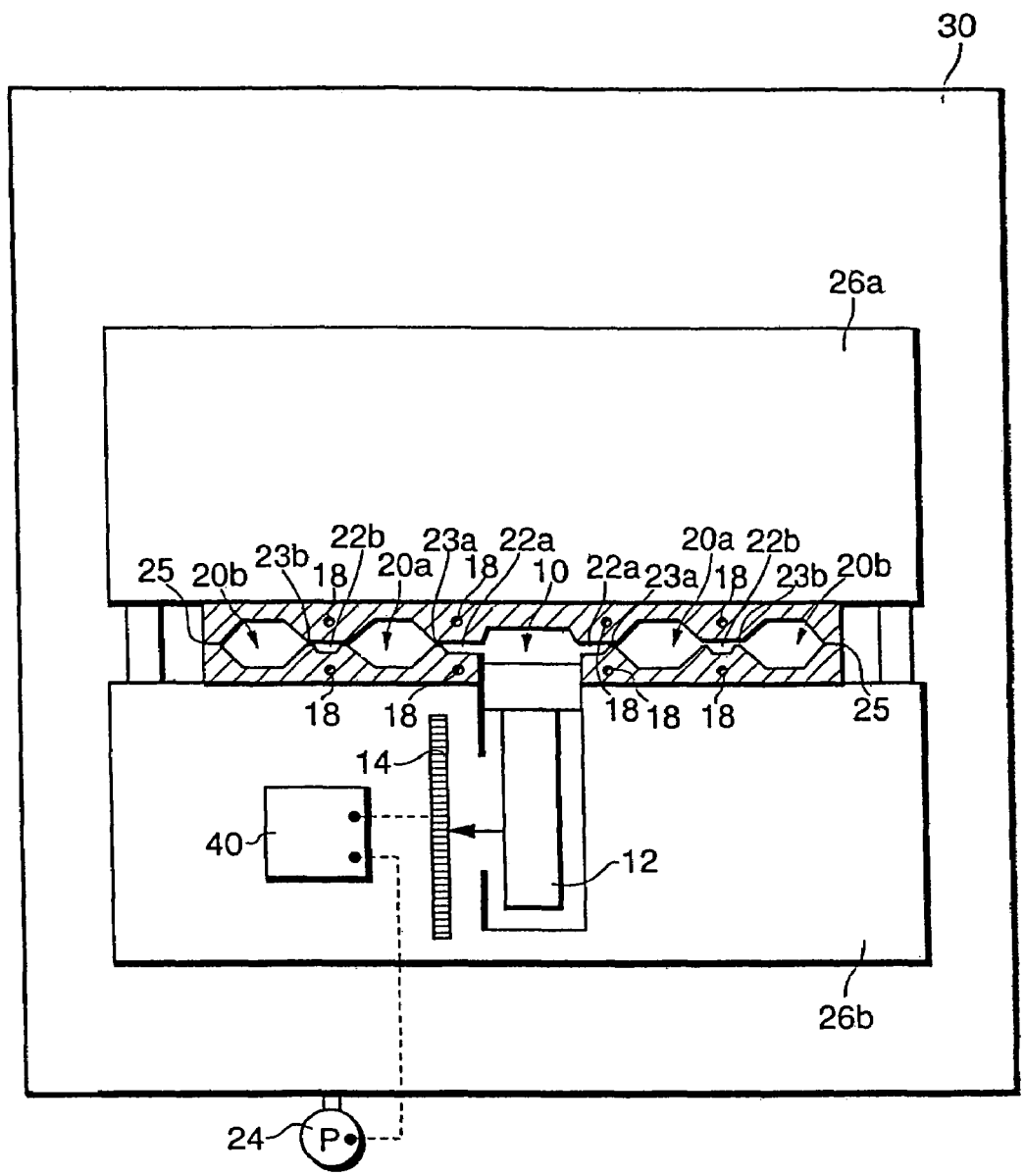
FIG. 5 is a sectional view showing a schematic construction of the transfer molding apparatus according to a third embodiment of the present invention.

When the top-half mold 16a and the bottom-half mold 16b are closed, a transfer pot 10, a first runner 22a communicating with the transfer pot 10, a first cavity 20a for accepting resin 28 from the first runner 22a through a first gate 23a, a second runner 22b communicating with the first cavity 20a, and a second cavity 20b for accepting resin 28 from the second runner 22b through a second gate 23b are formed on either side of the transfer pot 10 as shown in FIG. 5.

An air-vent-slot 25 is formed on one side of each second cavity 20b that is opposite the side where there is the second gate 23b. When the chamber 30 is placed at reduced pressure by extracting air by a suction pump 24, the air is sucked out from the first and second cavities 20a, 20b through the air-vent slots 25, so that the cavities 20 are placed at reduced pressure.

The pressure controller 40 drives the suction pump 24 to reduce the pressure in the chamber 30 when the position sensor 14 detects that the plunger 12 is at the position indicating that each cavity has been supplied with a specified amount of resin. When the position sensor 14 detects that the plunger 12 is at the position indicating that the first cavity 20a has been filled with resin 28 and also when the sensor 14 detects that the plunger 12 is at the position indicating that the second cavity 20b has been filled with resin 28, the pressure controller 40 causes the suction pump 24 to stop. On the other hand, the chamber 30 is brought back to normal pressure. Note that the other features of the third embodiment are the same as in the first embodiment, and therefore their descriptions are omitted.

Referring to FIG. 6, description will be made of a method for manufacturing semiconductor devices on the transfer molding apparatus constructed as described. FIG. 6 shows only the principal parts for convenience of explanation. Semiconductor-device-mounted lead frames (not shown) are set in the bottom-half mold 16b, then a resin tablet is loaded in the transfer pot 10, and by lowering the top platen 26a, the top-half mold 16a and the bottom-half mold 16b are closed. At this time, the semiconductor devices, not shown, have been placed almost in the center of the first and the second cavities 20a, 20b.

While the resin tablet charged in the transfer pot 10 is being melted by heating it to 160° to 190° C. by the heaters 18, the resin is extruded from the transfer pot 10 by raising the plunger 12. By this operation, the molten resin 28 is introduced into the first runners 22a.

The position sensor 14 detects the position of the plunger 12 from the start of its movement. As shown in FIG. 6(a), the position sensor 14 outputs a detection signal to the pressure controller 40 when the position sensor 14 detects that the leading end of the plunger 12 has reached the position A, which indicates that a specified amount of resin has been supplied from the first runner 22a into the first cavity 20a.

On receiving a detection signal from the position sensor 14, the pressure controller 40 transmits a drive start signal to the suction pump 24. In response to the drive start signal, the suction pump 24 starts to extract the air from the chamber 30, and gradually reduces the pressure in the chamber 30 to about 30 to 90 Pa.

Therefore, even if the resin 28 has been compressed at the first gate position 23a and the pressurized resin 28 is injected into the first cavity 20a, because the first cavity 20a is gradually changed from normal pressure to reduced pressure, the relative pressure difference between the pressure applied to the air bubbles in the resin 28 and the pressure in the first cavity 20a can be limited to a small degree, so that the air bubbles entrapped in the resin can be prevented from expanding greatly.

Figure 6B:
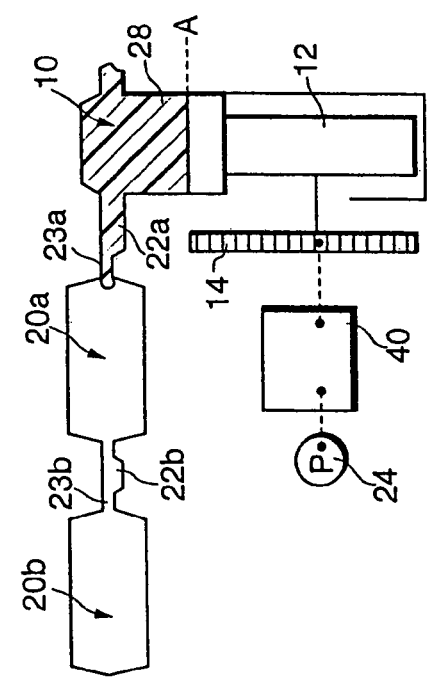
FIGS. 6(a)-6(d) are fragmentary diagrams for explaining the motion of the transfer molding apparatus shown in FIG. 5.

Timing for reducing the pressure in the chamber 30 by using the suction pump 24 may be when the resin decreases in viscosity and starts to harden, for example (in this case, when the resin 28 has been supplied to about one half of the first cavity 20a as shown in FIG. 6(b)). In other words, the timing for chamber pressure reduction may be when the leading end of the plunger 12 has reached the position B.

As described above, if the pressure in the chamber 30 is decreased after the viscosity of the resin has decreased, because the resin has already started to harden, the air bubbles are less liable to expand in the resin supplied in the first cavity 20a.

Subsequent to as shown in FIG. 6(b), when the cavity 20a has been filled with the resin 28 once the plunger 12 moves past the position B, the position sensor 14 outputs a detection signal to the pressure controller 40. On receiving the detection signal from the position sensor 14, the pressure controller 40 transmits a drive stop signal to the suction pump 24. By this drive stop signal, the suction pump 24 is stopped and the chamber 30 is brought back to normal pressure.

Figure 6D:
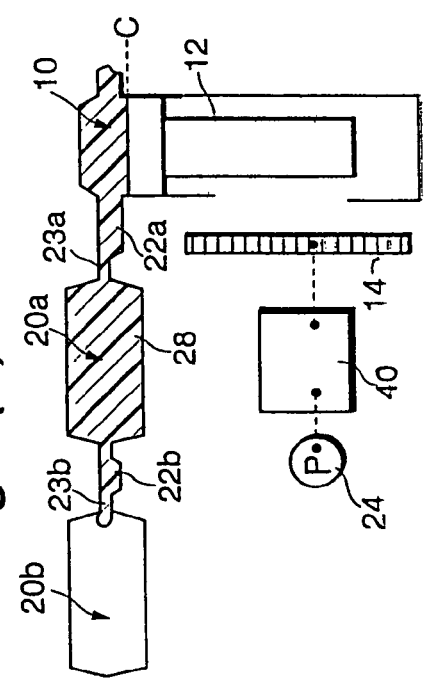
Figure 6A:
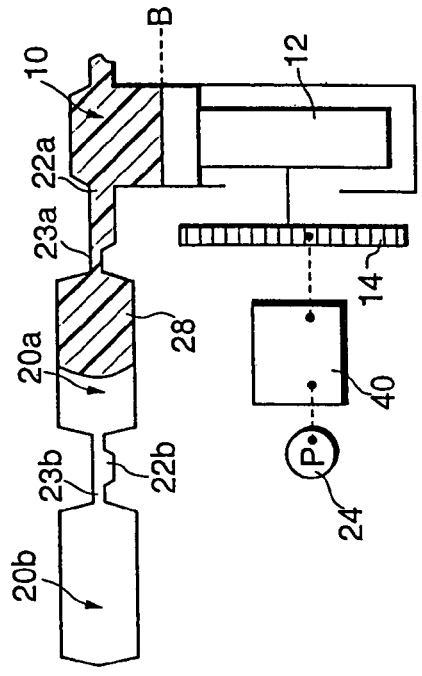
Figure 6C:
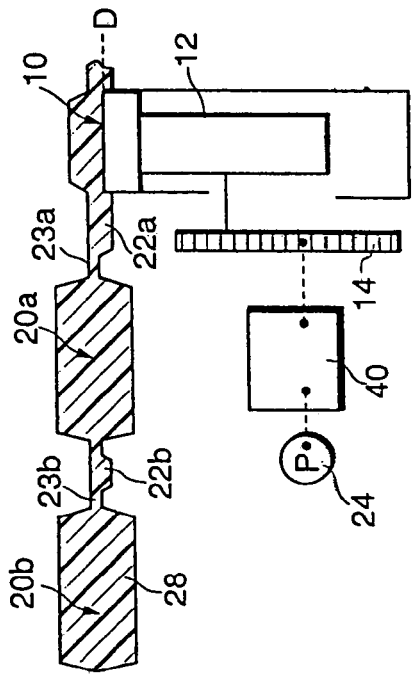
Figure 7:
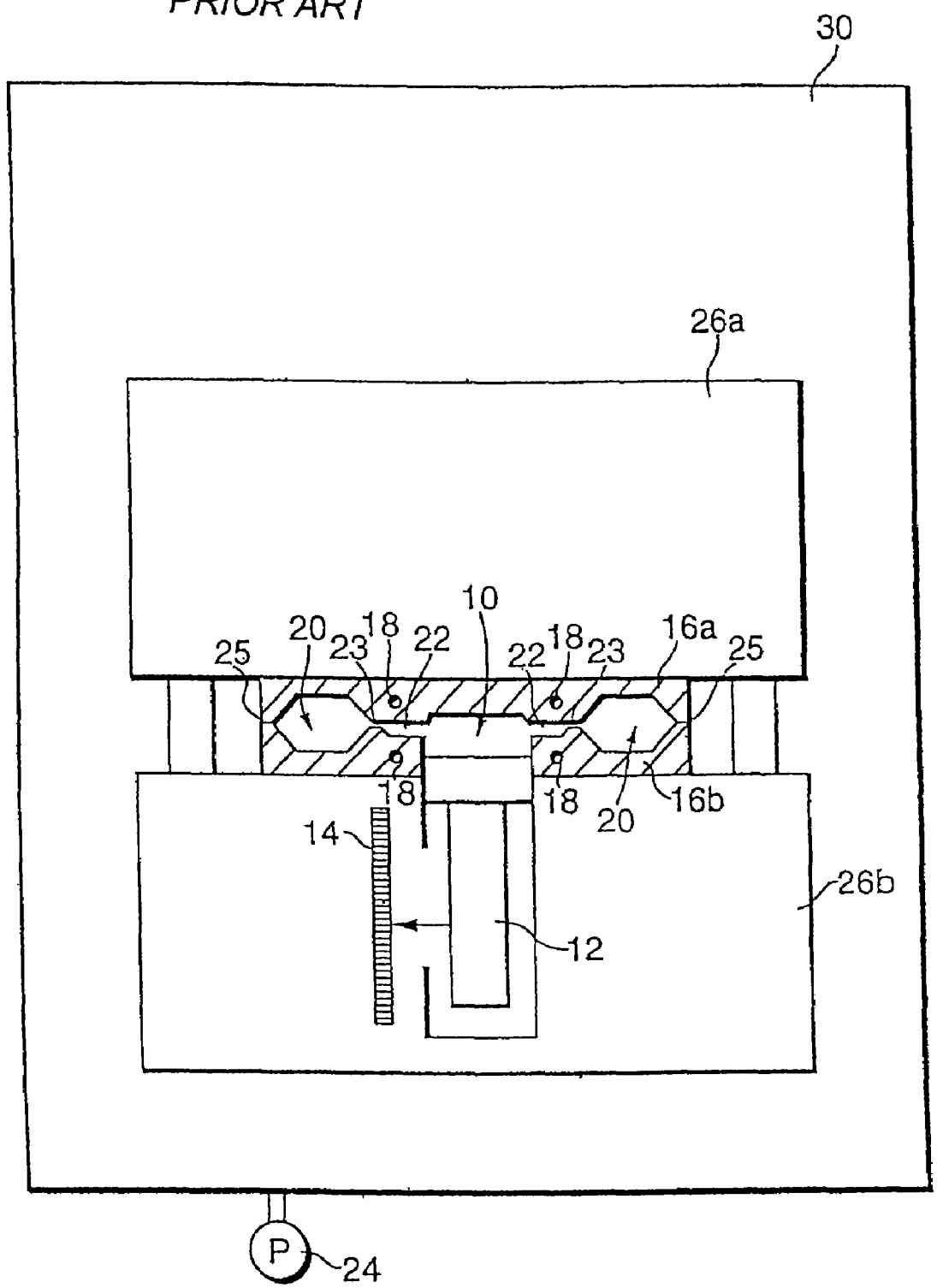
FIG. 7 is a sectional view showing a schematic construction of a conventional transfer molding apparatus.
Figure 8B:
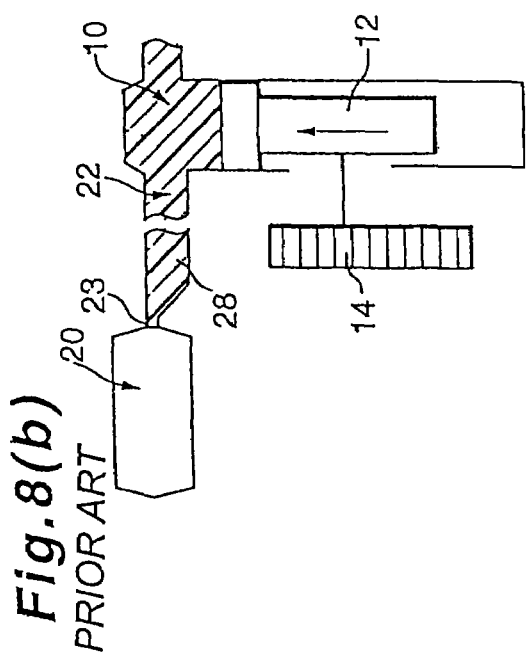
FIGS. 8(a)-8(d) are fragmentary diagram diagrams for explaining the motion of the transfer molding apparatus shown in FIG. 6.
Figure 8D:
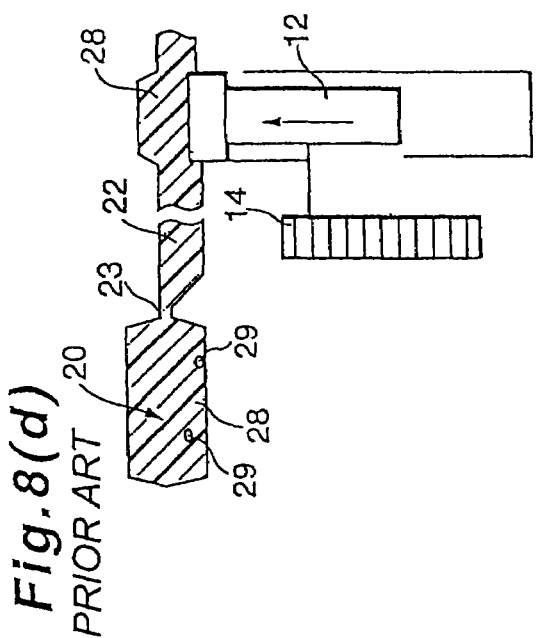
Figure 8A:
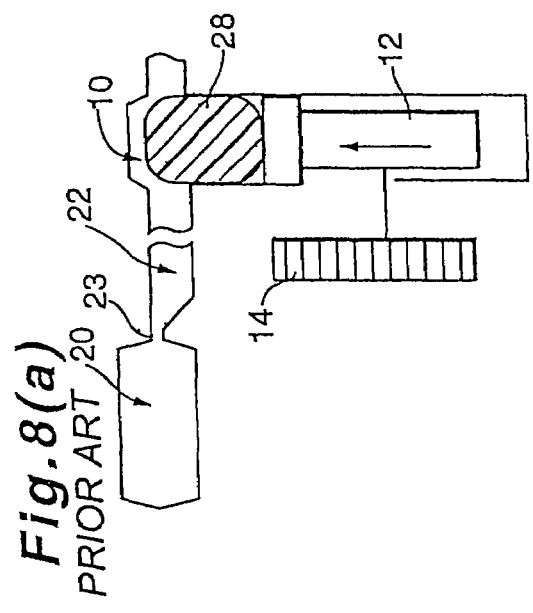
Figure 8C:
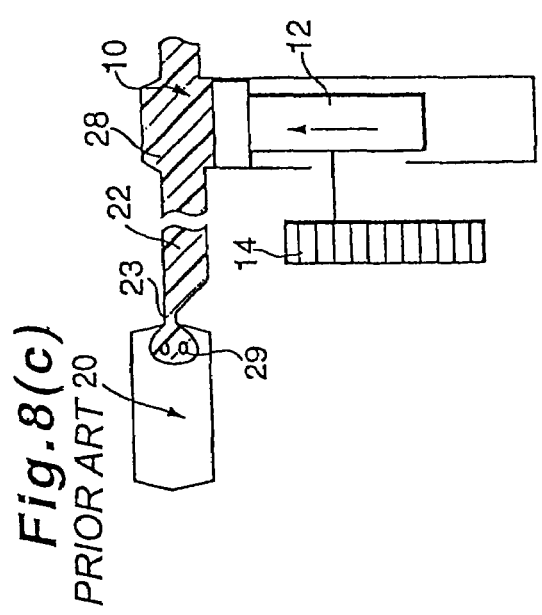

When a specified amount of resin 28 has been supplied from the second runner 22b to the second cavity 20b, the position sensor 14 detects that the plunger 12 has reached the position C, as shown in FIG. 6(c). When the position sensor 14 detects that the leading end of the plunger 12 arrived at position C, the position sensor 14 outputs a detection signal to the pressure controller 40.

When receiving the detection signal from the position sensor 14, the pressure controller 40 transmits a drive start signal to the suction pump 24, and the suction pump 24 starts to extract the air from the chamber 30 until the chamber 30 is reduced in pressure to about 30 to 90 Pa.

Therefore, even if the resin 28 is compressed at the position of the gate 23b and the pressurized resin 28 is injected into the second cavity 23b, because the second cavity 20b is gradually changed from normal pressure to reduced pressure, the relative pressure difference between the pressure applied to the air bubbles in the resin 28 and the pressure in the second cavity 20b can be limited to a small degree. Thus, the air bubbles entrapped in the resin can be prevented from expanding greatly.

Timing for reducing the pressure in the chamber 30 by using the suction pump 24 may be when the resin decreases in viscosity and starts to harden (in this case, when the resin 28 has been injected to about one half of the cavity 20b).

When the pressure in the chamber 30 is reduced after the viscosity of the resin in the second cavity 20b has decreased as described above, because the resin has started to harden, the air bubbles in the second cavity 20b are less liable to expand.

Subsequently, when the leading end of the plunger 12 has moved to the position D as shown in FIG. 6(d), which indicates that the second cavity 20b has been filled completely with the resin 28, the position sensor 14 outputs a detection signal to the pressure controller 40. In response to the detection signal, the pressure controller 40 sends a drive stop signal to the suction pump 24. By the drive stop signal, the suction pump 24 is stopped. On the other hand, the chamber 30 is brought back to normal pressure. At the same time, the plunger movement is also stopped, and the resin in the cavities 20a and 20b is cured.

After the resin 28 has been completely cured, the top platen 26a (see FIG. 5) is raised, a semiconductor device with a lead frame is ejected which is encapsulated in the resin package that has been cured around the semiconductor element. Subsequently, the excess resin is removed, the package is whittled to shape, the lead frame is trimmed, and the outer leads are formed. Thus, a semiconductor device is produced.

As described, according the third embodiment, when a specified amount of resin is successively injected into the first and second cavities 20a, 20b serially interconnected by the second runner 22b, the pressure controller 40 causes the suction pump to operate to adjust the pressure of the cavities. Therefore, there is provided an advantage that a plurality of semiconductor devices are formed simultaneously in addition to the advantage described with reference to the first embodiment.

The shape of the mold is not limited to the one shown in FIGS. 5 and 6, but may be a type for producing a package with multiple gates, such as formed in matrix. In this case, by detection of the position of the plunger 12 by the position sensor 14, it is possible to adjust the pressure of the cavities in a predetermined timing pattern, so that products without voids can be produced.

According to the third embodiment that has been described, the pressure controller 40 controls the suction pump according to the position of the plunger 12 detected by the position sensor 14. It is also possible to arrange for the pressure controller 40 to control the suction pump according to time counted by the timer 42*a* shown in FIGS. 4(*a*)-4(*d*).

More specifically, the pressure controller 40 drives the suction pump 24 to reduce the pressure in the chamber 30 when the timer 42*a* has counted time until a specified amount of resin 28 has been injected into the first cavity 20*a*, and when the timer 42*a* has counted time until a specified amount of resin has been injected into the second cavity 20*b*. In this case, the pressure controller 40 causes the suction pump 24 to stop when the timer 42*a* has counted time when the first cavity 20*a* has been completely filled with the resin 28 and time when the second cavity 20*b* has been completely filled with the resin 28.

In all the embodiments described above, the transfer molding apparatus has included one transfer pot for convenience of explanation. However, the present invention can be applied to transfer-molding apparatuses having a plurality of transfer pots. Similarly, in all the embodiments described above, for convenience of explanation, the transfer molding apparatus has included two runners communicating with the transfer pot, but the present invention can be applied to transfer molding apparatuses including one or more than three runners communicating with the transfer pot.

As has been described, according to the present invention, there is provided a transfer molding apparatus which prevents the expansion of air bubbles in the resin resulting from a relative pressure difference between the pressure in the resin and the pressure in the cavity and thereby prevents the voids from remaining the package.

According to the method of manufacturing semiconductor devices with less chances of voids remaining in the package.

The invention claimed is:

1. A method of manufacturing a semiconductor device, comprising:
   placing a lead frame having a semiconductor element mounted thereon, between a top-half mold and a bottom-half mold;
   forcing resin into a cavity formed by the top-half mold and the bottom-half mold using a plunger;
   reducing a pressure in the cavity by extracting air from the cavity using a suction pump, when a specified amount of resin has been supplied to the cavity; and
   detecting a position of the plunger using a position sensor, to determine when the specified amount of resin has been supplied to the cavity.

2. The method of manufacturing a semiconductor device of claim 1, wherein the specified amount of resin is an amount of resin that fills about one half of the cavity.

3. The method of manufacturing a semiconductor device of claim 1, wherein the specified amount of resin is an amount of resin that is supplied to the cavity without hardening.

4. A method of manufacturing a semiconductor device, comprising:
   placing a lead frame having a semiconductor element mounted thereon, between a top-half mold and a bottom-half mold;
   forcing resin into a cavity formed by the top-half mold and the bottom-half mold using a plunger;
   reducing a pressure in the cavity by extracting air from the cavity using a suction pump, when a specified amount of resin has been supplied to the cavity; and
   detecting an amount of time the plunger is driven using a timer, to determine when the specified amount of resin has been supplied to the cavity.

5. A method of manufacturing a semiconductor device, comprising:
   placing a lead frame having a semiconductor element mounted thereon, between a top-half mold and a bottom-half mold;
   introducing resin into a cavity formed by the top-half mold and the bottom-half mold using a plunger;
   determining an amount of time the plunger is driven using a timer; and
   reducing a pressure in the cavity by extracting air from the cavity using a suction pump, according to the amount of time the plunger is driven.

6. The method of manufacturing a semiconductor device of claim 5, wherein said reducing a pressure in the cavity begins once the plunger is driven an amount of time necessary to introduce an amount of resin that fills about one half of the cavity.

7. The method of manufacturing a semiconductor device of claim 5, wherein said reducing a pressure in the cavity begins once the plunger is driven an amount of time necessary for the resin that is introduced into the cavity to begin hardening.

8. A method of manufacturing semiconductor device packages comprising:
   providing a transfer molding apparatus including a top-half mold and a bottom-half mold that forms a cavity as a molding space for a package, a transfer pot as a resin loading space, and a plunger that communicates with the transfer pot to force resin out of the pot and into the cavity;
   placing a lead frame having a semiconductor element mounted thereon between the top-half mold and the bottom-half mold within the cavity;
   introducing resin into the cavity using the plunger; and
   reducing a pressure in the cavity using a suction pump to extract air from the cavity when a specified amount of resin has been introduced to the cavity, to form a semiconductor device package.

9. The method of manufacturing semiconductor device packages of claim 8, wherein the specified amount of resin is an amount of resin that fills about one half of the cavity.

10. The method of manufacturing semiconductor device packages of claim 8, further comprising detecting a position of the plunger using a position sensor, to determine when the specified amount of resin has been introduced to the cavity.

11. The method for manufacturing semiconductor device packages of claim 8, further comprising detecting an amount of time the plunger is driven using a timer, to determine when the specified amount of resin has been introduced to the cavity.

12. The method of manufacturing semiconductor device packages of claim 8, wherein the specified amount of resin is an amount of resin that is supplied to the cavity without hardening.

* * * * *